(12) United States Patent
Kai et al.

(10) Patent No.: US 6,576,526 B2
(45) Date of Patent: Jun. 10, 2003

(54) DARC LAYER FOR MIM PROCESS INTEGRATION

(75) Inventors: Shao Kai, Singapore (SG); Wu-Guan Ping, Singapore (SG); Chen Liang, Singapore (SG); Cheng-Wei Hua, Singapore (SG); Sanford Chu, Singapore (SG); Daniel Yen, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/900,398

(22) Filed: Jul. 9, 2001

(65) Prior Publication Data

US 2003/0008467 A1 Jan. 9, 2003

(51) Int. Cl.$^7$ ............................................. H01L 21/20
(52) U.S. Cl. .................. 438/393; 438/399; 438/601; 438/636; 438/637; 438/648; 438/672; 438/675; 438/685
(58) Field of Search ................. 438/132, 253, 438/393, 396, 601, 636, 637, 675, 648, 672, 685

(56) References Cited

U.S. PATENT DOCUMENTS

| | | | |
|---|---|---|---|
| 5,268,315 A | | 12/1993 | Prasad et al. .................. 437/31 |
| 5,812,364 A | | 9/1998 | Oku et al. .................... 361/312 |
| 5,920,775 A | * | 7/1999 | Koh ............................ 438/241 |
| 5,946,567 A | | 8/1999 | Weng et al. .................. 438/250 |
| 5,985,731 A | | 11/1999 | Weng et al. .................. 438/396 |
| 6,083,805 A | | 7/2000 | Ouellet et al. ............... 438/396 |
| 6,110,772 A | | 8/2000 | Takada et al. ............... 438/238 |
| 6,124,165 A | * | 9/2000 | Lien ............................ 438/253 |
| 6,156,640 A | * | 12/2000 | Tsai et al. .................... 438/636 |
| 6,174,766 B1 | | 1/2001 | Hayashi et al. .............. 438/241 |
| 6,500,763 B2 | * | 12/2002 | Kim et al. .................... 438/689 |

* cited by examiner

Primary Examiner—Hoai Ho
Assistant Examiner—Reneé R. Berry
(74) Attorney, Agent, or Firm—George O. Saile; Rosemary L. S. Pike

(57) ABSTRACT

A new processing sequence is provided for the creation of a MIM capacitor. The process starts with the deposition of a first layer of metal. Next are deposited listed, a thin layer of metal, a layer of insulation, a second layer of metal and a layer of Anti Reflective Coating. An etch is then performed to form the second electrode of the MIM capacitor (using the etch stop layer to stop this etch), MIM spacers are formed on the sidewalls of the second electrode of the MIM capacitor (also using the etch stop layer to stop this etch). The dielectric and first electrode of the MIM capacitor are formed by etching through the second layer of insulation and the first layer of metal. This is followed by conventional processing to create contact points to the MIM capacitor.

21 Claims, 4 Drawing Sheets

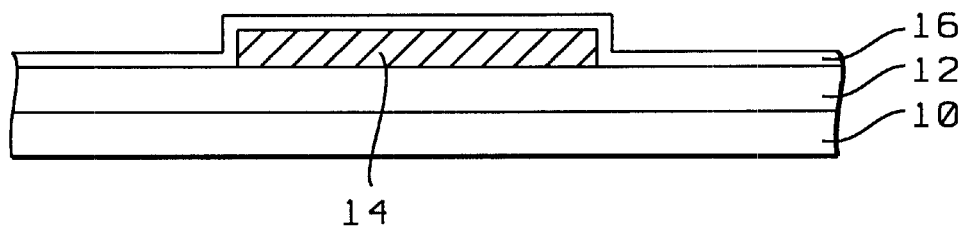
FIG. 1 – Prior Art
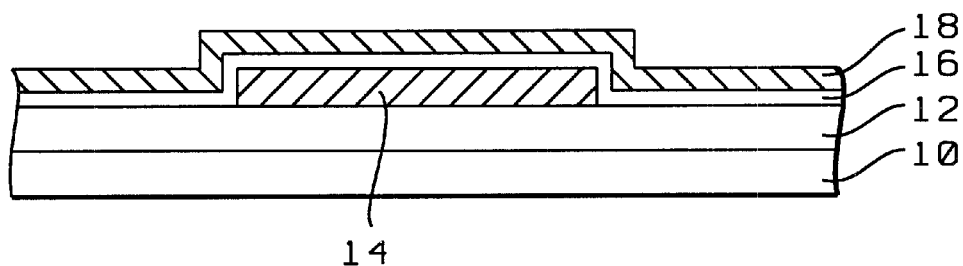
FIG. 2 – Prior Art
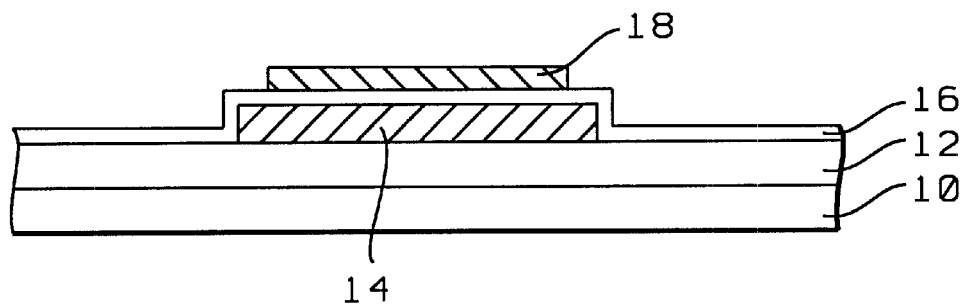
FIG. 3 – Prior Art

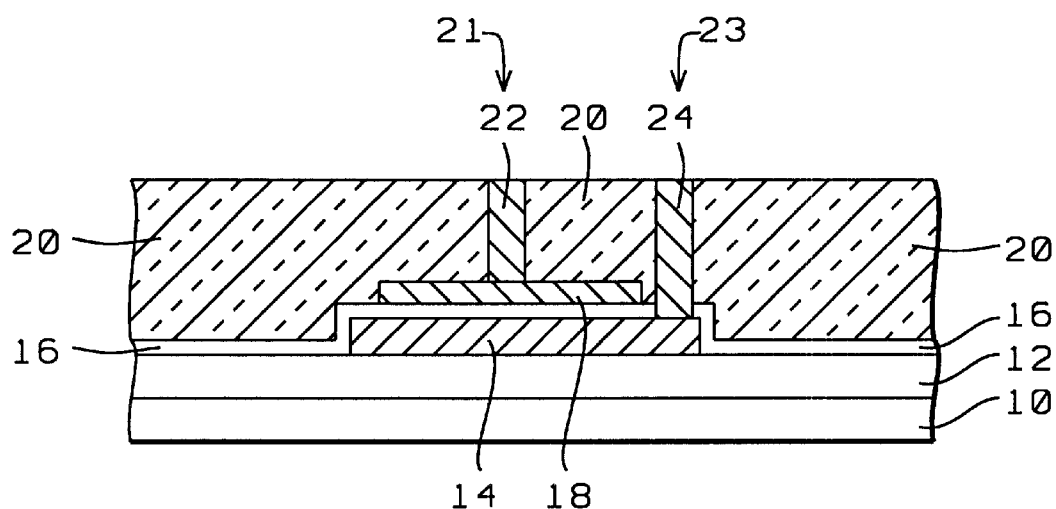
FIG. 4 – Prior Art
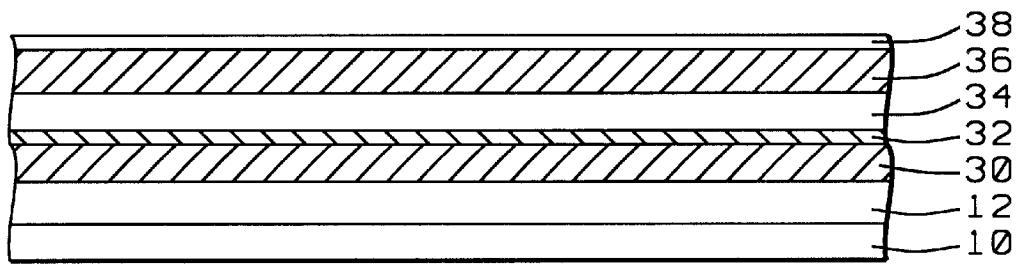
FIG. 5
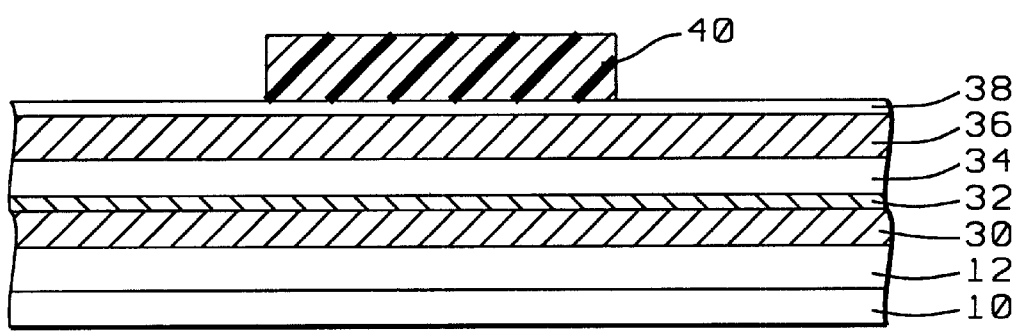
FIG. 6

DARC LAYER FOR MIM PROCESS INTEGRATION

BACKGROUND OF THE INVENTION (1) Field of the Invention

The invention relates to the fabrication of integrated circuit devices, and more particularly, to a method for the creation of a Metal-Insulator-Metal (MIM) capacitor for using in rf or mixed signal applications.

(2) Description of the Prior Art

Modern semiconductor technology requires the creation of high performance semiconductor devices that are produced at competitive prices. A direct result of this requirement is that device density and inter-device packaging density continue to increase from which directly follows the requirement that the surface area or space that is available on the surface of a semiconductor substrate is carefully allocated and maximized in its use.

The majority of semiconductor devices perform functions of digital data processing, electronic circuitry can nevertheless be divided into two broad fields. One field addresses digital processing while the second field addresses the manipulation of analog signals. Digital semiconductor devices have as function the manipulation or storage of digital information. The functions of analog electronic circuitry have in previous years typically been handled by separate components such as relatively large capacitors or relatively large inductors. The separate components may have been applied in combination with digital processing capabilities, whereby however a significant portion of the functional implementation has been realized by the use of for instance capacitive and inductive components in addition to and functionally collaborating with the digital components. Circuit requirements that are imposed on components that are required for analog processing have in the past limited the integration of such components into typical semiconductor integrated circuit devices.

Modern mobile communication applications center around compact high-frequency equipment. With the continued improvements in the performance characteristics of this equipment, continued emphasis will be placed on small size of the equipment, low power consumption, increased frequency applications and low noise levels. Semiconductor devices are used in the field of mobile communication for the creation of Radio Frequency (RF) amplifiers. A major component of a typical RF amplifier is a tuned circuit that contains inductive and capacitive components. Major components used for the creation of high frequency analog semiconductor devices are capacitors and inductors that form a LC resonance circuit. Most high Q inductors and capacitors form part of a hybrid device configuration or of Monolithic Microwave Integrated Circuits (MMIC's) or are created as discrete components, the creation of which is not readily integratable into a typical process of Integrated Circuit manufacturing.

By combining the creation on one semiconductor monolithic substrate of circuitry that is aimed at combining the functions of analog data manipulation and analog data storage with the functions of digital data manipulation and digital data storage, a number of significant advantages are achieved. Such advantages include the reduction of manufacturing costs and the reduction of power consumption by the combined functions. Radio Frequency (rf) and analog circuits are integrated with high-speed and high-performance digital circuits in CMOS mixed-signal applications. Requirements that are imposed on capacitors that are created for mixed-mode applications are the creation of a capacitor that has a high quality factor Q, that has a linear capacitive value over a range of voltages applied between the electrodes of the capacitor, that is not dependent in its performance on the temperature over which the capacitor is applied, that can be created as part of a CMOS processing cycle, that can be created as part of the creation of sub-micron devices, that has high unit capacitance with low voltage coefficients and low contact resistance. The invention provides a process for the creation of a capacitor that addresses these issues.

U.S. Pat. No. 6,083,805 (Ouellet et al.) shows a capacitor with various TiN/Ti layers—col. 2, lines 31–47.

U.S. Pat. No. 5,812,364 (Oku et al.) shows a MIM capacitor.

U.S. Pat. No. 5,268,315 (Prasad et al.), U.S. Pat. No. 6,110,772 (Takada et al.), U.S. Pat. No. 6,174,766 (Hayashi et al.), U.S. Pat. No. 5,946,567 (Weng et al.) and U.S. Pat. No. 5,985,731 (Weng et al.) show related capacitors and processes.

SUMMARY OF THE INVENTION

A principle objective of the invention is to create a Metal-Insulator-Metal (MIM) capacitor for mixed signal applications.

Another objective of the invention is to provide a process of creating a MIM capacitor that allows for the use of a good anti reflection layer for the second electrode mask.

Yet another objective of the invention is to provide a process of creating a MIM capacitor that allows for the use of a good stop or buffer layer for subsequent via etch processing.

A still further objective of the invention is to provide a process of creating a MIM capacitor that allows for the use of a good stop layer for MIM spacer etch and for the protection of the upper electrode surface.

In accordance with the objectives of the invention a new processing sequence is provided for the creation of a MIM capacitor. The process starts with the deposition of a first layer of metal (for the first electrode of the MIM capacitor), preferably comprising an aluminum-copper alloy, over a semiconductor surface. Next are deposited in the sequence listed, a thin layer of metal (for a surface layer of the first electrode of the MIM capacitor, as a buffer layer for the via etch), preferably comprising titanium nitride, a layer of insulation that has the dual functions of serving as the dielectric for the MIM capacitor and of serving as an etch stop layer (used during the various etching steps of the invention that is during the etch for the second electrode of the MIM capacitor, during a spacer etch and during a via etch to establish contacts to the MIM capacitor), preferably comprising silicon nitride, a second layer of metal (for the second electrode of the MIM capacitor), preferably comprising titanium nitride and a layer of Anti Reflective Coating (forming a good anti reflection layer for the second electrode mask in addition to serving as a layer of protection of the surface of the second electrode during the spacer etch). An etch is then performed to form the second electrode of the MIM capacitor (using the etch stop layer to stop this etch), MIM spacers are formed on the sidewalls of the second electrode of the MIM capacitor (also using the etch stop layer to stop this etch), the MIM capacitor is isolated by etching through the second layer of insulation and the first layer of metal of the first electrode. This is followed by conventional processing to create contact points to the MIM capacitor.

BRIEF DESCRIPTION OF THE DRAWINGS

FIGS. 1 through 4 show a convention method of creating a MIM capacitor, as follows:

FIG. 1 shows a cross section of a semiconductor substrate, a layer of insulation has been deposited over the surface of the substrate, a first layer metal has been deposited and patterned, creating a first electrode of the capacitor, a first layer of capacitor dielectric has been deposited over the surface of the substrate.

FIG. 2 shows a cross section of the substrate after a second layer of metal has been deposited over the layer of capacitor dielectric.

FIG. 3 shows a cross section after the second layer of metal has been patterned and etched creating a second electrode for a MIM capacitor.

FIG. 4 shows a cross section of the substrate after the layer of dielectric has been deposited over the substrate, openings have been created in the layer of dielectric, these openings have been filled with metal forming metal contact plugs to the first and the second electrodes of the MIM capacitor.

FIGS. 5 through 11 address the invention, as follows:

FIG. 5 shows a cross section of a semiconductor substrate, a layer of insulation has been deposited over the surface of the substrate, successive layers of the invention have been deposited over the surface of the layer of insulation.

FIG. 6 shows a cross section after a layer of photoresist has been deposited and developed in preparation for the etch of the second electrode of the capacitor.

FIG. 7 shows a cross section after the second electrode of the capacitor has been etched, a layer of spacer dielectric has been deposited.

FIG. 8 shows a cross section after spacers have been formed on the sidewalls of the second electrode of the capacitor.

FIG. 9 shows a cross section after a patterned layer of photoresist has been created in preparation for etching the layers of dielectric and first electrode metal of the capacitor.

FIG. 10 shows a cross section after the layers of dielectric and first electrode metal have been etched, the layer of photoresist has been removed from the surface.

FIG. 11 shows a cross section of the processing that is required to establish points of electrical contact to the capacitor.

DESCRIPTION OF THE PREFERRED EMBODIMENTS

Figure 7:
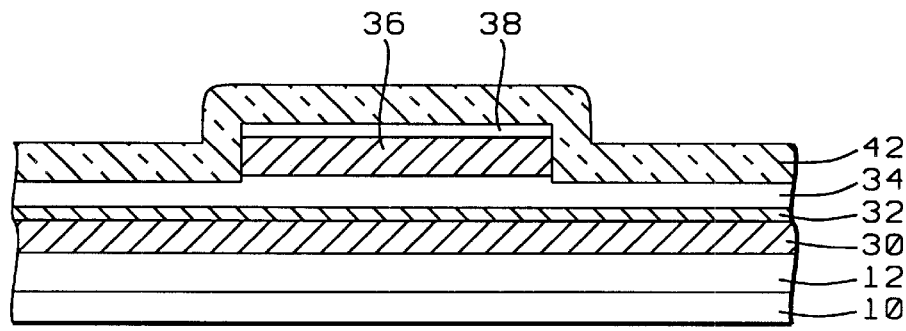

FIGS. 1 through 4 first address conventional procedures for the creation of a MIM capacitor. These procedures are included in order to better illustrate the advantages that are provided by the invention.

Referring now specifically to FIG. 1, there is shows a cross section of a silicon substrate 10, it is assumed that semiconductor devices (not shown in FIG. 1) have been created in or on the surface of substrate 10, among these semiconductor devices are preferably included CMOS devices of either positive (PMOS) or negative (NMOS) polarity. An insulation layer 12, typically comprising silicon oxide ($SiO2$) has been deposited over the surface of substrate 10 using methods of Plasma Enhanced Chemical Vapor Deposition (PECVD) to a thickness of between about 7000 and 13000 Angstrom. It is also possible to deposit layer 12 to a thickness in excess of 13000 Angstrom and to further polish the surface of the deposited layer 12 of insulation using methods of Chemical Mechanical Polishing (CMP), reducing the thickness of this layer to about 13000 Angstrom.

A layer 14 of conductive material, typically comprising an aluminum copper (AlCu) alloy is deposited over the surface of layer 12 of insulation to a thickness between about 4000 and 8000 Angstrom using methods of Physical Vapor Deposition (CVD). Layer 14 is then patterned and etched using conventional methods of photolithography and anisotropic plasma etching, removing the layer 14 from above the surface of layer 12 of insulation in a pattern that forms the first electrode 14 of a MIM capacitor.

Next deposited over the surface of the patterned layer 14 of the first electrode of the MIM capacitor is a layer 16 of capacitor dielectric, for instance comprising silicon dioxide ($SiO2$), deposited using methods of CVD to a thickness of between about 100 and 1000 Angstrom. Other, high dielectric constant dielectrics can be used for layer 16, such as a layer of oxide-nitride-oxide (ONO). In depositing a layer of ONO, that is a layer of oxide-nitride-oxide, the first layer of oxide is native oxide or thermally grown oxide or CVD deposited oxide. The nitride is grown in a low power furnace at a temperature within the range of 600 to 700 degrees C. to a thickness within the range of between 40 and 200 Angstrom, the final oxidation layer is grown in a low power furnace at a temperature within the range between 750 and 800 degrees C. for a time period within the range between 30 and 60 minutes. The material that is typically used for the layer 16 of dielectric is required to comprise a high dielectric constant material and can therefore comprise silicon oxide ($SiO2$), silicon nitride ($Si_3N_4$), tantalum pentoxide ($TaO_5$), all of these material to be deposited to a thickness between about 100 and 1000 Angstrom.

Next to be formed must be the second electrode of the MIM capacitor. For this, a layer 18, FIG. 2, of conductive material, typically comprising titanium nitride (TiN) is deposited over the surface of the layer 16 of capacitor dielectric to a thickness between about 500 and 1000 Angstrom using methods of CVD. Layer 18 can also be sputter deposited using a titanium target in a nitrogen environment. The material that is used for the second electrode is not limited to titanium nitride but can also comprise other metals such as aluminum mixed with copper or alloys thereof, copper or tungsten.

After the layers for the first electrode, the dielectric and the second electrode of the MIM capacitor have been deposited, the deposited layer 18, which is used for the second electrode of the MIM capacitor, must be etched as shown in cross section in FIG. 3. Left in place of layer 18 is a portion of layer 18 that aligns with the lower electrode 14 of the MIM capacitor while enough of the layer 18 is removed so that a contact with the lower electrode can be established. This becomes more clear from the cross section that is shown in FIG. 4. Etching that is applied for the creation of the patterned layer of 18 that is shown in cross section on FIG. 8 can be a plasma etch that however must have a high etch ratio of the metal of the layer 18 with respect to the underlying layer 16 of capacitor dielectric. This etch ratio (of metal of layer 18 versus the dielectric of layer 16) is typically as a minimum 3:1 and preferably exceeds this ratio. If aluminum or copper or an alloy thereof is used for layer 18, the etch of this layer 18 for the creation of the second electrode of the MIM capacitor can be a high-density plasma (HDP) etch using Cl as an etchant gas. A layer 18 of TiN can be etched using Reactive Ion Etching (RIE) of HDP etching applying an etchant gas such as boron trichloride ($BCl_3$) or $Cl_2$.

The cross section that is shown in FIG. 3 essentially completes the creation of the MIM capacitor. As a final step is shown in cross section of FIG. 4 the establishing of connects to the first (14) and second (18) electrode of the MIM capacitor. For this purpose a relatively thick layer 20 of dielectric or insulation is deposited to a thickness of between about 20000 and 24000 Angstrom, using methods of PECVD and forming a layer of Inter Metal Dielectric (IMD). Inter Metal Dielectric layer 20 can contain any suitable dielectric such as silicon dioxide ("oxide", doped or undoped) or silicon nitride ("nitride"), silicon oxynitride, fluoropolymer, parylene, polyimide, tetra-ethyl-orthosilicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

Conventional methods of photolithography combined with anisotropic etching are used to create openings 21 and 23 through the layer 20 of IMD. After these openings 21 and 23 have been created, a conducting metal, such as an aluminum/copper alloy, is deposited over the surface of layer 20, filling the openings 21 and 23 with this conducting metal and establishing contact plugs 22 and 24. Contact plug 22 connects with the second electrode 18 of the MIM capacitor while contact plug 24 connects with the first electrode 14 of the MIM capacitor.

In current semiconductor technology, the application of an anti-reflective coating (ARC) is widely used for the formation of a mask that is used for the patterning and etching of the metal layers that are part of a MIM capacitor. Anti reflective coatings form one of the methods that are used to reduce the scattered light phenomenon. ARC's are typically a polymer film that is, for the exposure wavelengths, highly absorbing of the incident light and non-bleaching. The light absorption by the ARC coating reduces the intensity of the reflected light and, in so doing, allows critical dimensions of device feature size to be accomplished. The ARC coating can typically be applied directly to the surface of a substrate after which the photoresist can be deposited on top of the ARC coating. ARC coating can also be applied to the construction of more complex device features such as, for instance, gate structures for MOSFET devices. The ARC coating can also be combined with the deposition of other materials such as the insertion of a layer of SiON between the photoresist and the underlying gate material. The application of an ARC coating partially planarizes the wafer topography thereby reducing light scattering effects. The underlying layer of ARC makes the layer of photoresist more uniform, which helps to reduce variations in line width of device features.

The following FIGS. 5 through 11 will now be described in detail, these figures show the invention for the creation of a MIM capacitor.

Shown in the cross section of FIG. 5 are the following layers and surfaces:

10, is the cross section of a semiconductor surface, which preferably comprises a monocrystalline silicon substrate 12 is a layer of insulation that has been deposited over the surface of the substrate 10; this layer of insulation preferably comprises silicon dioxide and is preferably deposited to a thickness between about 7000 and 1300 Angstrom but more preferably to a thickness of about 10000 Angstrom 30 is a layer of aluminum copper (AlCu) alloy, deposited over the surface of layer 12 of insulation to a thickness of preferably between about 4000 and 8000 Angstrom but more preferably 5000 Angstrom using methods of Physical Vapor Deposition (CVD)

32 is a layer of titanium nitride (TiN) that has been deposited over the surface of the layer 30 of capacitor aluminum copper (AlCu) alloy to a thickness preferably between about 300 and 400 Angstrom but more preferably to a thickness of about 350 Angstrom using methods of PVD. Layer 32 can also be sputter deposited using a titanium target in a nitrogen environment; the combined layers 30 and 32 are used for the first electrode of the MIM capacitor as will be clear for following cross sections; layer 32 further serves as a buffer layer during subsequent via etching as will be clear at a later time (see FIG. 10)

34 is a layer of silicon nitride ($Si_3N_4$); the layer 34 of silicon nitride ($Si_3Ni_4$) can be deposited using PECVD procedures at a pressure between about 200 mTorr and 400 mTorr, at a temperature between about 600 and 800 degrees C., to a thickness preferably of about 500 and 700 Angstrom but more preferably of about 600 Angstrom using $NH_3$ and $SiH_4$ or $SiCl_2H_2$. The silicon nitride layer 34 can also be deposited using PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness preferably of about 500 and 700 Angstrom but more preferably of about 600 Angstrom; layer 34 of silicon nitride performs the dual function of serving as a layer of dielectric (insulation) between the first and the second electrode of the MIM capacitor and of serving as an etch stop layer during subsequent steps of etching; this latter function will become more clear in the following figures of the invention 36 is a layer of titanium nitride (TiN); layer 36 of TiN can be deposited using titanium nitride as a source at a deposition temperature of about 25 degrees C., deposited for a time of about 20 seconds using a PVD process, preferably deposited to a thickness of between about 1500 and 2500 Angstrom but more preferably deposited to a thickness of about 2000 Angstrom; the second electrode of the MIM capacitor will be formed from layer 36

38 is a layer of ARC material; conventional materials and conventional methods of deposition can be applied for the creation of layer 38 of ARC, this layer is preferably deposited to a thickness of between about 300 to 500 Angstrom but more preferably to a thickness of about 400 Angstrom.

From the cross section that is shown in FIG. 5, the layers 30 and 32 are used to form the first electrode of the MIM capacitor, layer 34 is the dielectric layer of the MIM capacitor while layer 36 is used to form the second electrode of the MIM capacitor.

In the cross section that is shown in FIG. 6, a patterned and developed layer 40 of photoresist has been created on the surface of layer 38 of ARC. Conventional methods of spin coating the layer 40 of photoresist are used for the deposition of layer 40 of photoresist, these conventional methods are followed with methods of photolithographic exposure and development of the deposited layer of photoresist, leaving in place on the surface of layer 38 of ARC a patterned layer 40 of photoresist that is aligned with the to be created second electrode of the MIM capacitor.

Layers 38 and 36 are next etched, shown in cross section in FIG. 7, using layer 34 of silicon nitride as the etch stop layer and therefore partially penetrating this layer 34 is accordance with the pattern of the overlying layer 40 of photoresist. As a final layer that is shown in cross section in FIG. 7 is a layer 42 of spacer dielectric that has been deposited over the surface of the exposed layer 34 of silicon nitride and the surface of the etched layers 36/38. Layer 42 is used to form spacers over the sidewalls of the etched layer 36 which, as previously indicated, forms the second electrode of the MIM capacitor.

Etching of layer 36 of TiN typically uses anisotropic etching with an etchant gas of one of the group of $CF_4$, $CHF_3$, $CHCl_3$, $CCl_4$, $BCl_4$ and $Cl_2$ at a temperature between about 100 and 200 degrees C.

Spacers over sidewalls of semiconductor constructs, such as gate electrode or capacitor constructs, are typically formed using materials such as silicon nitride, silicon oxide, BSG, PSG, polysilicon, other materials preferably of a dielectric nature, CVD oxide formed from a TEOS source. Often used materials are amorphous materials that inhibit the deposition of epitaxial silicon thereupon. Spacers can for instance be formed by first depositing a layer of silicon oxide after which applying an anisotropic RIE procedure using $CHF_3$, $CF_4$ and $H_2$ as an etchant.

Figure 8:
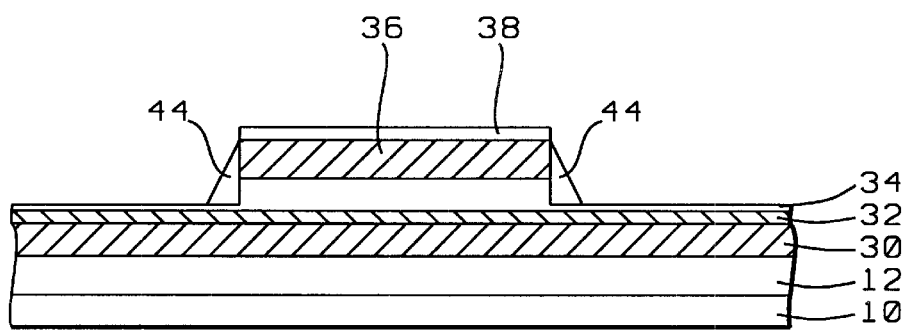

Specifically, spacers 44, FIG. 8, can be formed using a PECVD process, using tetraethylorthosilicate as a source, to deposit a silicon layer 42 at a temperature between about 500 and 700 degrees C. to a thickness between about 2000 and 4000 Angstrom. Anisotropic selective RIE processing using $CH_4$ and $H_2$ as etchants is used to create silicon oxide sidewall spacers.

FIG. 8 shows a cross section where spacers 44 have been created on the sidewalls of layer 36 of TiN (the second electrode of the MIM capacitor) in accordance with the processing steps as indicated above. It must be noted in FIG. 8 that the thickness of layer 34 of silicon nitride, that is overlying the surface of layer 32 of titanium nitride, has been reduced in height by an amount. This because the layer 34 of silicon nitride is used as the etch stop layer for the etch of the spacer layer 42, FIG. 7. Layer 34, of etch stop, is, as part of the function of serving as an etch stop, reduced in thickness before the etch of layer 42 is completed.

Figure 9:
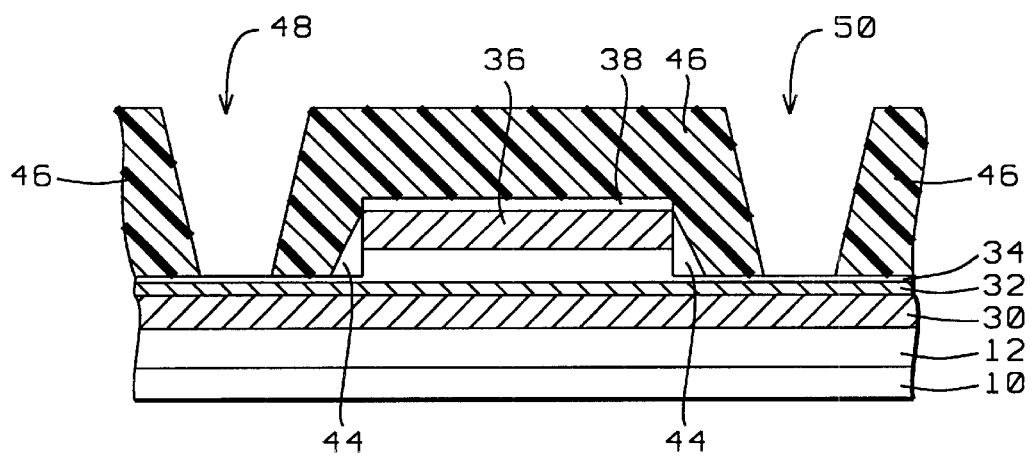
Figure 10:
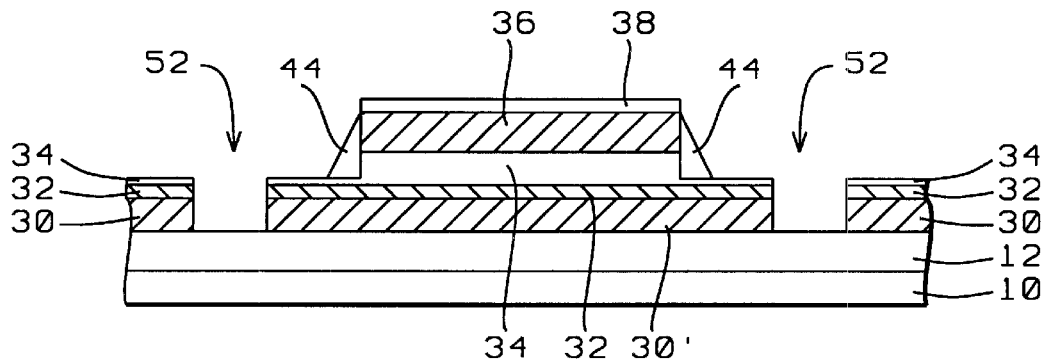

FIG. 9 shows a cross section after a layer 46 of photoresist has been deposited over the structure of FIG. 8, this layer is patterned and developed using conventional methods of photolithography and exposure. Openings 48 and 50 have in this manner been created through the layer 46 of photoresist, these openings 48 and 50 are created for the purpose of etching the dielectric layer 34 and the first electrode layer 30/32 of the MIM capacitor, thereby isolating the MIM capacitor from its surrounding environment. This is further shown in the cross section that is shown in FIG. 10, where the patterned layer 46 of photoresist has been used as a mask for the etching of the underlying layers 34, 32 and 30. Layer 34 of silicon nitride serves as an stop layer for the development of the layer 46 of photoresist and serves as an etch stop layer for the etching of the underlying layer 32 of TiN and 30 of AlCu alloy.

The objective in the deposition and development of photoresist layer 46 is to create openings 48 and 50 in this layer so that these openings can be used to electrically isolate the MIM capacitor, that is to separate the first electrode 30 of the MIM capacitor from its surroundings. This is shown in FIG. 10 where openings 52 have been etched, penetrating through layers 34, 32 and 30 down to the surface of the layer 12 of insulation. This in effect creates the first electrode 30' that is shown in cross section in FIG. 10. It is clear that first electrode 30' has been created by etching layer 30, FIG. 9, in accordance with the openings 48 and 50 that have been created in the layer 46 of photoresist. Methods and processing conditions for the various layers have previously been highlighted and will therefore not be further discussed at this time.

Figure 11:
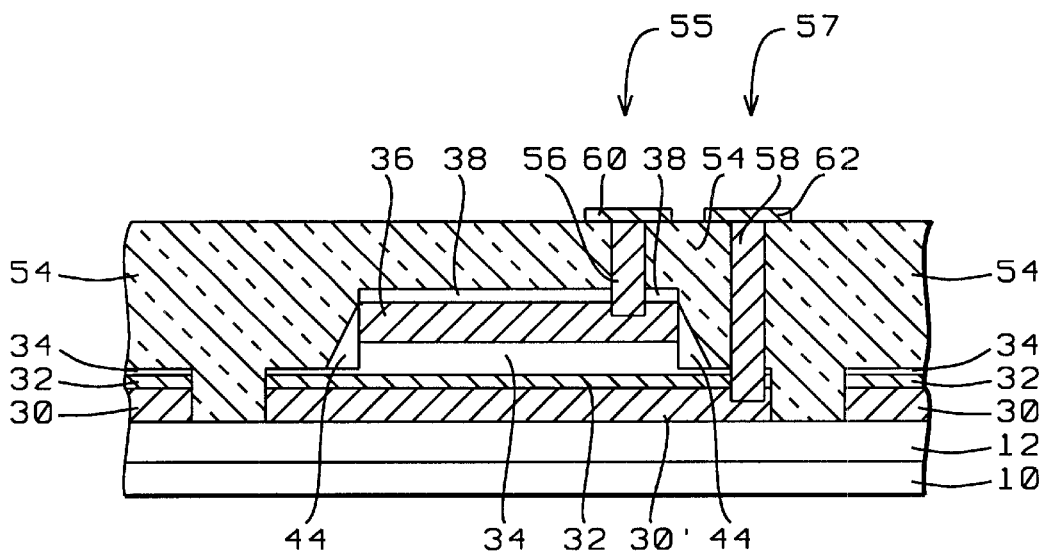

As a final step in the creation of a MIM capacitor, the creation of contact points to the first and second electrodes of the MIM capacitor is shown in cross section in FIG. 11. A layer 54 of IMD has been deposited over the structure of FIG. 10, openings 55 and 57 have been created in the layer 54 of dielectric penetrating down to layer 36 of the second electrode of the MIM capacitor and layer 30' of the first electrode of the MIM capacitor. The openings 55 and 57 have been filled with a layer of metal which has been polished down to a thickness overlying the surface of layer 54 of dielectric, creating conductive plugs 56, to the second electrode of the MIM capacitor, and conductive plug 58 to the first electrode 30' of the MIM capacitor. The thickness of metal that remains in place overlying the surface of the layer 54 of dielectric can further be patterned, thereby creating interconnect traces or contact pads 60 and 62 which are shown in cross section in FIG. 11. It is clear from the cross section that is shown in FIG. 11 that the MIM capacitor is now ready for further interconnection, using contact points 60 and 62 to access the second (36) and first (30') electrode of the MIM capacitor. This completes the MIM capacitor of the invention.

Layer 54 of dielectric can be a relatively thick layer of dielectric or insulation and is typically deposited to a thickness of between about 20000 and 24000 Angstrom, using methods of PECVD and forming a layer of Inter Metal Dielectric (IMD). Inter Metal Dielectric layer 54 can contain any suitable dielectric such as silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), a low dielectric constant material, such as hydrogen silsesquioxane and HDP-FSG (high-density-plasma fluorine-doped silicate glass.

Conventional methods of photolithography combined with anisotropic etching are used to create openings 55 and 57 for conductive plugs 56 and 58 through the layer 54 of IMD. After these openings have been created though the layer 54 of IMD, a conducting metal, such as an aluminum/copper alloy, is deposited over the surface of layer 54, filling the openings with this conducting metal and establishing contact plugs 56 and 58. Normally, the plug will be filed using CVD-W, followed by an etch back or CMP, followed by depositing metal using methods of PVD. The alloy process is at this time a (very old) process for the 0.5 $\mu$m device size devices.

A brief review of the various layers and their functions in the creation of the MIM capacitor of the invention is of value, as follows:

layer 30 of an aluminum-copper alloy is used to form the first electrode 30' of the MIM capacitor, FIG. 10 layer 32 of titanium nitride is a surface layer for the first electrode of the MIM capacitor and further serves as a buffer layer during the etching of layers 34 (of insulation that serves as the capacitive dielectric) and 30 (for the etch of the first electrode of the capacitor), FIG. 10; layer 32 of titanium nitride also serves as an ARC layer for the masking of the layer of metal layer 34 of silicon nitride serves as an etch stop layer during the etch of the second electrode of the capacitor, FIG. 7, during the spacer etch, FIG. 8, and during the via etch which creates the dielectric layer and the first electrode of the MIM capacitor, FIG. 10 layer 36 of titanium nitride forms the second electrode of the MIM capacitor, FIG. 7, and layer 38 of DARC forms a good anti-reflective layer for the mask that is used for the etch of the second electrode (for the exposure and development of layer 40 of photoresist, FIG. 6) and serves as a protective layer which protects the surface of the second electrode during the spacer etch, FIG. 7; layer 38 of DARC also serves as a stop layer for the via etch shown in FIG. 11.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for creating capacitors, comprising the steps of:

providing a semiconductor substrate, said substrate having been provided with semiconductor devices in or on the surface thereof;

depositing a first insulation layer over the surface of said substrate;

depositing a first conducting layer over the surface of said first insulation layer;

depositing an second insulation layer over the surface of said first conducting layer;

depositing a second conducting layer over the surface of said second insulation layer;

depositing a layer of anti-reflective coating over the surface of said second conducting layer;

patterning said layer of anti-reflective coating and said second conductive layer, leaving portions of said anti-reflective coating and said second conductive layer over said second insulation layer;

forming spacers on sidewalls of said second conductive layer, exposing the surface of said second insulation layer;

patterning said second insulation layer and said first conductive layer, creating vias through said second insulation layer and said first conductive layer, leaving a portion of said second insulation layer and said first conductive layer in place underlying said patterned layer of anti-reflective coating and said patterned second conductive layer, said portion of said second insulation layer and said first conductive layer left in place symmetrically extending from said patterned layer of anti-reflective coating and said patterned second conductive layer and said spacers by a measurable amount; and creating conductive interconnects to said portion of said patterned first conductive layer that has been left in place and said portion of said patterned second conductive layer that has been left in place.

2. The method of claim 1 wherein said depositing a first insulation layer over the surface of said substrate comprises depositing a layer of silicon dioxide to a thickness preferably between 7000 and 13000 Angstrom but more preferably to a thickness of about 10000 Angstrom.

3. The method of claim 1 wherein said depositing a first conducting layer over the surface of said first insulation layer comprises depositing a layer of aluminum-copper alloy, deposited to a thickness of preferably between about 4000 and 8000 Angstrom but more preferably 5000 Angstrom followed by depositing a layer of titanium nitride (TiN), deposited to a thickness preferably between about 300 and 400 Angstrom but more preferably to a thickness of about 350 Angstrom.

4. The method of claim 1 wherein said depositing a second insulation layer over the surface of said first conducting layer comprises depositing a layer of silicon nitride ($Si_3N_4$) to a thickness preferably of about 500 and 700 Angstrom but more preferably to a thickness of about 600 Angstrom.

5. The method of claim 1 wherein said depositing a second conducting layer over the surface of said insulation layer comprises depositing a layer of titanium nitride (TiN) preferably deposited to a thickness of between about 1500 and 2500 Angstrom but more preferably deposited to a thickness of about 2000 Angstrom.

6. The method of claim 1 wherein said depositing a layer of anti-reflective coating over the surface of said second conducting layer comprises depositing a layer of anti-reflective coating material, deposited to a thickness of between about 300 to 500 Angstrom but more preferably to a thickness of about 400 Angstrom.

7. The method of claim 1 wherein said patterning said layer of anti-reflective coating and said second conductive layer, leaving portions of said anti-reflective coating and said second conductive layer over said layer comprises applying anisotropic etching with an etchant gas of one of the group of $CF_4$, $CHF_3$, $CHCl_3$, $CCl_4$, $BCl_4$ and $Cl_2$ at a temperature between about 100 and 200 degrees C. using said insulation layer deposited over the surface of said first conducting layer as an etch stop layer.

8. The method of claim 1 wherein said forming spacers on sidewalls of said second conductive layer comprises depositing a material selected from the group consisting of silicon nitride, silicon oxide, BSG, PSG, polysilicon, CVD oxide formed from a TEOS source, amorphous materials, deposited over said patterned layer of anti-reflective coating and said patterned second conductive layer, including sidewalls of said patterned second conductive layer, further including said exposed surface of said second insulation layer, and applying an anisotropic RIE procedure using $CHF_3$, $CF_4$ and $H_2$ as an etchant.

9. The method of claim 1 wherein said forming spacers on sidewalls of said second conductive layer comprises using a PECVD process, using tetraethylorthosilicate as a source, to deposit a silicon layer over said patterned layer of anti-reflective coating and said patterned second conductive layer, including sidewalls of said patterned second conductive layer, further including said exposed surface of said second insulation layer, deposited at a temperature of about 400 degrees C. to a thickness between about 2000 and 4000 Angstrom and applying anisotropic selective RIE processing using $CH_4$ and $H_2$ as etchants to create silicon oxide sidewall spacers over sidewalls of said patterned second conductive layer.

10. The method of claim 1 wherein said creating conductive interconnects to said portion of said patterned first conductive layer that has been left in place and said portion of said patterned second conductive layer that has been left in place comprises the steps of:

depositing a layer of Inter Metal Dielectric (IMD) over the surface of said layer of Anti-Reflective Coating, including the exposed surface of said spacers created on sidewalls of said second conductive layer, further including exposed surfaces of said second insulation layer;

creating openings through said layer of (IMD), said openings exposing the surface of said patterned layer of said second conductive layer, said openings further exposing the surface of said patterned layer of said first conductive layer;

depositing a layer of metal over the surface of said layer of IMD, filling said openings created in said layer of IMD with a layer of metal, creating conductive plugs through said layer of IMD contacting said patterned layer of said first conductive layer and said patterned layer of said second conductive layer;

polished the surface of said deposited layer of metal down to a thickness overlying the surface of said layer of IMD; and patterning said thickness of said metal overlying the surface of said layer of IMD, creating points of interconnect to said patterned layer of said first conductive layer and said patterned layer of said second conductive layer.

11. A method for creating capacitors, comprising the steps of:

providing a semiconductor substrate, said substrate having been provided with semiconductor devices in or on the surface thereof;

depositing a first insulation layer over the surface of said substrate;

depositing a first conducting layer over the surface of said first insulation layer;

depositing an etch stop layer over the surface of said first conducting layer;

depositing a layer of capacitor dielectric over the surface of said etch stop layer;

depositing a second conducting layer over the surface of said layer of capacitance dielectric;

depositing a layer of anti-reflective coating over the surface of said second conducting layer;

patterning said layer of anti-reflective coating and said second conductive layer, using said etch stop layer as an etch stop, leaving portions of said anti-reflective coating and said second conductive layer overlying said layer of capacitor dielectric, exposing the surface of said etch stop layer;

forming spacers on sidewalls of said second conductive layer;

patterning said capacitor dielectric layer, said etch stop layer and said first conduction layer, creating vias through said capacitor dielectric layer, said etch stop layer and said first conduction layer, leaving a portion of said capacitor dielectric layer, said etch stop layer and said first conduction layer in place underlying said patterned layer of anti-reflective coating and said patterned second conductive layer, said vias through said capacitor dielectric layer, through said etch stop layer and through said first conduction layer being located adjacent to said spacers being removed from said spacers in a direction of a plane that is parallel with the surface of said substrate by a first distance, portions of said capacitor dielectric layer, said etch stop layer and said first conduction layer left in place symmetrically extending from said patterned layer of anti-reflective coating and said patterned second conductive layer and said spacers by said first distance; and creating conductive interconnects to said portion of said patterned first conductive layer that has been left in place and said portion of said patterned second conductive layer that has been left in place.

12. The method of claim 11 wherein said depositing a first insulation layer over the surface of said substrate comprises depositing a layer of silicon dioxide to a thickness preferably between 7000 and 13000 Angstrom but more preferably to a thickness of about 10000 Angstrom.

13. The method of claim 11 wherein said depositing a first conducting layer over the surface of said first insulation layer comprises depositing a layer of aluminum-copper alloy, deposited to a thickness of preferably between about 4000 and 8000 Angstrom but more preferably 5000 Angstrom.

14. The method of claim 11 wherein said depositing an etch stop layer over the surface of said first conducting layer comprises depositing a layer of titanium nitride (TiN), deposited to a thickness preferably between about 300 and 400 Angstrom but more preferably to a thickness of about 350 Angstrom.

15. The method of claim 11 wherein said depositing a layer of capacitor dielectric over the surface of said etch stop layer comprises depositing a layer of silicon nitride ($Si_3N_4$) to a thickness preferably of about 500 and 700 Angstrom but more preferably to a thickness of about 600 Angstrom.

16. The method of claim 11 wherein said depositing a second conducting layer over the surface of said insulation layer comprises depositing a layer of titanium nitride (TiN) preferably deposited to a thickness of between about 1500 and 2500 Angstrom but more preferably deposited to a thickness of about 2000 Angstrom.

17. The method of claim 11 wherein said depositing a layer of anti-reflective coating over the surface of said second conducting layer comprises depositing a layer of anti-reflective coating material, deposited to a thickness of between about 300 to 500 Angstrom but more preferably to a thickness of about 400 Angstrom.

18. The method of claim 11 wherein said patterning said layer of anti-reflective coating and said second conductive layer comprises applying anisotropic etching with an etchant gas of one of the group of $CF_4$, $CHF_3$, $CHCl_3$, $CCl_4$, $BCl_4$ and $Cl_2$ at a temperature between about 100 and 200 degrees C. using said insulation layer deposited over the surface of said first conducting layer as an etch stop layer.

19. The method of claim 11 wherein said forming spacers on sidewalls of said second conductive layer comprises depositing a material selected from the group consisting of silicon nitride, silicon oxide, BSG, PSG, polysilicon, CVD oxide formed from a TEOS source, amorphous materials over said patterned layer of anti-reflective coating and said patterned second conductive layer, including sidewalls of said patterned second conductive layer, further including said exposed surface of said etch stop layer, and applying an anisotropic RIE procedure using $CHF_3$, $CF_4$ and $H_2$ as an etchant.

20. The method of claim 11 wherein said forming spacers on sidewalls of said second conductive layer comprises using a PECVD process, using tetraethylorthosilicate as a source, to deposit a silicon layer over said patterned layer of anti-reflective coating and said patterned second conductive layer, including sidewalls of said patterned second conductive layer, further including said exposed surface of said etch stop layer, deposited at a temperature of about 400 degrees C. to a thickness between about 2000 and 4000 Angstrom and applying anisotropic selective RIE processing using $CH_4$ and $H_2$ as etchants to create silicon oxide sidewall spacers over sidewalls of said patterned second conductive layer.

21. The method of claim 11 wherein said creating conductive interconnects to said portion of said patterned first conductive layer that has been left in place and said portion of said patterned second conductive layer that has been left in place comprises the steps of:

depositing a layer of Inter Metal Dielectric (IMD) over the surface of said layer of Anti-Reflective Coating, including the exposed surface of said spacers created on sidewalls of said second conductive layer, further including exposed surfaces of said second insulation layer;

creating openings through said layer of (IMD), said openings exposing the surface of said patterned layer of said second conductive layer, said openings further exposing the surface of said patterned layer of said first conductive layer;

depositing a layer of metal over the surface of said layer of IMD, filling said openings created in said layer of IMD with a layer of metal, creating conductive plugs through said layer of IMD contacting said patterned layer of said first conductive layer and said patterned layer of said second conductive layer;

polished the surface of said deposited layer of metal down to a thickness overlying the surface of said layer of IMD; and patterning said thickness of said metal overlying the surface of said layer of IMD, creating points of interconnect to said patterned layer of said first conductive layer and said patterned layer.

* * * * *